(12) United States Patent
Sun et al.

(10) Patent No.: US 12,601,086 B2
(45) Date of Patent: Apr. 14, 2026

(54) APPARATUS AND METHOD FOR SYNTHESIZING AND CONTINUOUSLY GROWING PHOSPHIDE IN MAGNETIC FIELD IN IMMERSION FASHION

(71) Applicant: THE 13TH RESEARCH INSTITUTE OF CHINA ELECTRONICS TECHNOLOGY GROUP CORPORATION, Shijiazhuang (CN)

(72) Inventors: Niefeng Sun, Shijiazhuang (CN); Shujie Wang, Shijiazhuang (CN); Senfeng Xu, Shijiazhuang (CN); Yanlei Shi, Shijiazhuang (CN); Huimin Shao, Shijiazhuang (CN); Lijie Fu, Shijiazhuang (CN); Aimin Bu, Shijiazhuang (CN); Xiaolan Li, Shijiazhuang (CN); Yang Wang, Shijiazhuang (CN)

(73) Assignee: The 13th Research Institute of China Electronics Technology Group Corporation, Hebei (CN)

( * ) Notice: Subject to any disclaimer, the term of this patent is extended or adjusted under 35 U.S.C. 154(b) by 328 days.

(21) Appl. No.: 18/577,074

(22) PCT Filed: Dec. 8, 2021

(86) PCT No.: PCT/CN2021/136321
§ 371 (c)(1),
(2) Date: Jan. 5, 2024

(87) PCT Pub. No.: WO2023/279652
PCT Pub. Date: Jan. 12, 2023

(65) Prior Publication Data
US 2024/0352624 A1 Oct. 24, 2024

(30) Foreign Application Priority Data
Jul. 6, 2021 (CN) .......................... 202110760633.2

(51) Int. Cl.
*C30B 11/04* (2006.01)
*C30B 11/00* (2006.01)
(Continued)

(52) U.S. Cl.
CPC ............ *C30B 29/44* (2013.01); *C30B 11/003* (2013.01); *C30B 11/04* (2013.01); *C30B 15/02* (2013.01); *C30B 15/14* (2013.01); *C30B 30/04* (2013.01)

(58) Field of Classification Search
CPC ....... C30B 11/003; C30B 11/04; C30B 15/02; C30B 15/14; C30B 15/305; C30B 27/00;
(Continued)

(56) References Cited

U.S. PATENT DOCUMENTS

| 3,591,340 A | * | 7/1971 | Plaskett | ................. | C30B 11/12 |
| | | | | | 117/77 |
| 5,431,125 A | | 7/1995 | Bachowski et al. | | |

(Continued)

FOREIGN PATENT DOCUMENTS

| CN | 108358180 A | 8/2019 |
| CN | 111424310 A | 2/2022 |

(Continued)

OTHER PUBLICATIONS

International Preliminary Report on Patentability mailed Dec. 14, 2023 in PCT/CN2021/136321.
(Continued)

*Primary Examiner* — Matthew J Song
(74) *Attorney, Agent, or Firm* — AP3 Law Firm PLLC

(57) ABSTRACT

Device and method for immersed synthesis and continuous growth of phosphides under a magnetic field are disclosed in the field of semiconductor material preparation. In particular, device and method for synthesizing and growing semiconductor phosphides by means of immersing phosphorus
(Continued)

into a metal melt under the action of a static magnetic field are disclosed. The device includes a furnace body, an injection synthesis system and a static magnetic field generator. The method includes A, heating the crucible to melt the metal and a covering material boron oxide in the crucible; B, immersing red phosphorus into the crucible; C, applying a static magnetic field surrounding the crucible, and adjusting the temperature gradient to start the synthesis; and D, performing crystal growth after completion of the synthesis. With the method provided by the present invention, the red phosphorus sinks into the melt in the form of a solid and floats upward from the bottom of the crucible after gasification, solving problems such as sucking-back generated by use of phosphorus bubbles; the transverse static magnetic field suppresses the bubble up-floating rate while suppressing the melt convection in the direction of the temperature gradient, so that the synthesis process is smoother and more rapid.

10 Claims, 7 Drawing Sheets

(51) Int. Cl.
*C30B 15/02* (2006.01)
*C30B 15/14* (2006.01)
*C30B 29/44* (2006.01)
*C30B 30/04* (2006.01)

(58) Field of Classification Search
CPC ......... C30B 27/02; C30B 29/40; C30B 29/44; C30B 30/04
See application file for complete search history.

(56) References Cited

U.S. PATENT DOCUMENTS

| | | | | |
|---|---|---|---|---|
| 5,698,029 A | * | 12/1997 | Fujikawa | C30B 29/40 |
| | | | | 117/200 |
| 2009/0314996 A1 | * | 12/2009 | Kawazoe | C30B 29/06 |
| | | | | 438/510 |

FOREIGN PATENT DOCUMENTS

| | | |
|---|---|---|
| CN | 113502546 A | 8/2022 |
| CN | 113512755 A | 10/2022 |

OTHER PUBLICATIONS

International Search Report and Written Opinion mailed Nov. 21, 2023 in PCT/CN2021/136321.

* cited by examiner

APPARATUS AND METHOD FOR SYNTHESIZING AND CONTINUOUSLY GROWING PHOSPHIDE IN MAGNETIC FIELD IN IMMERSION FASHION

CROSS-REFERENCE

This application claims the priority of PCT Application Publication No. WO/2023/279652, filed on Dec. 8, 2021, which claims priority to Chinese Patent Application No. 202110760633.2, filed on Jul. 6, 2021, the entirety of both priority applications is hereby incorporated by reference.

FIELD OF THE INVENTION

The present invention belongs to the field of semiconductor material preparation, in particular to a method for synthesizing and growing semiconductor phosphides by means of immersing phosphorus into a metal melt under the action of a static magnetic field.

BACKGROUND OF THE INVENTION

Semiconductor phosphides contain indium phosphide, gallium phosphide, zinc germanium phosphide, etc., which are widely used in microelectronic, optoelectronic, acousto-optic and other fields. These phosphides are synthesized mainly by the injection synthesis technology and the diffusion synthesis technology.

The diffusion synthesis method is long in diffusion time, low in efficiency, and low in purity of the synthesized material. The injection synthesis technology is to inject a phosphorus gas directly into a melt, and generate a large number of bubbles accompanying the flow of the melt. The synthesis efficiency is very high. The injection synthesis technology is the most efficient method for large-scale synthesis of phosphides. The usual injection synthesis technology involves heating quartz bubbles loaded with red phosphorus, and then injecting a sublimated phosphorus gas into a melt through an injection tube connected to the quartz bubbles. This method faces problems such as controlling the pressure balance of the system, and is highly susceptible to causing the melt to be sucked back into the injection tube and solidify to clog the tube and then cause explosion.

In order to solve this problem, methods have been invented for performing synthesis using a process of putting the mixture of phosphorus powder and metal powder into the melt, and mixing an inert gas into a phosphorus gas to increase the pressure in the quartz bubbles to prevent sucking-back. The above methods are demanding in terms of equipment and process.

SUMMARY OF THE INVENTION

The objective of the present invention is to solve the above problems.

In order to achieve the objective of the present invention, the following technical solution is adopted: a device for immersed synthesis and growth of phosphides under a magnetic field, comprising a main furnace body, a crucible in the main furnace body, and heaters and thermal insulation layers surrounding the crucible, wherein the device for synthesis and growth further comprises an injection synthesis system connected to a driving device, the injection synthesis system carrying red phosphorus, and immersed into the crucible under the action of the driving device; and a static magnetic field generator is disposed outside the main furnace body.

The injection synthesis system comprises a cylindrical red phosphorus injector, and injection holes are formed at the periphery of the red phosphorus injector.

The injection synthesis system also comprises 3-5 disc-shaped shielding layers above the red phosphorus injector, the diameter of the shielding layers is 1 to 10 mm smaller than the inner diameter of the crucible, and the shielding layers are provided with through holes.

According to the positions of the shielding layers, the crucible is divided into different temperature areas, having temperature area ranges between every two shielding layers, above the shielding layer at the top, and below the shielding layer at the bottom; and each temperature area is provided with an independent heater and a thermocouple.

The red phosphorus injector and the shielding layers are connected to the driving device to ascend and descend simultaneously.

In the thermal insulation layers surrounding the crucible, thermal insulation boards are disposed corresponding to the positions of the shielding layers.

Each of the shielding layers is provided with a thermometer hole at the same position to cooperate with a top thermocouple.

Based on the above device, the present invention also provides a method for immersed synthesis and continuous growth of phosphides under magnetic field, comprising the following steps:

A, heating the crucible to melt the metal and a covering material boron oxide in the crucible.

B, immersing red phosphorus into the crucible.

C, applying a static magnetic field surrounding the crucible, and adjusting the temperature gradient to start the synthesis.

D, performing crystal growth after completion of the synthesis.

The injector loaded with the solid red phosphorus is located in the lowest area in the crucible, and the solid red phosphorus is sublimated to a gas by heating and forms bubbles that float upward in the melt and are rapidly absorbed in the high temperature area.

With the device and method provided by the present invention, the red phosphorus sinks into the melt in the form of a solid and floats upward from the bottom of the crucible after gasification, solving problems such as sucking-back generated by use of phosphorus bubbles; the transverse static magnetic field suppresses the bubble up-floating rate while suppressing the melt convection in the direction of the temperature gradient, so that the synthesis process is smoother and more rapid.

In which, 1: main furnace body; 2: upper furnace cover; 3: furnace base tray; 4: static magnetic field generator; 5: the injection synthesis system; 5-1: synthesis main body rod; 5-2: first shielding layer; 5-3: second shielding layer; 5-4: third shielding layer; 5-5: red phosphorus injector; 5-6: through hole; 5-7: first thermometer hole; 5-8: second thermometer bole; 5-9: third thermometer hole; 5-10: injection hole; 5-11: loading inlet; 5-12: sealing cap; 6: injection rod; 6-1: injection system screw; 6-2: injection rotation drive; 6-3: injection lifting drive; 6-4: injection lifting plate; 7: crucible; 7-1: lining; 8: boron oxide; 9; melt; 10: first thermal insulation layer; 11: second thermal insulation layer; 12: third thermal insulation layer 13: fourth thermal insulation layer; 14: lower thermal insulation layer; 15: first heater; 16: second heater; 17: third heater; 18: fourth heater; 19: crucible support; 20: crucible rod; 21: crucible rod drive; 22: top thermocouple; 22-1: temperature measurement drive; 22-2: temperature measurement fixing plate; 22-3: temperature measurement screw; 23: seed crystal rod; 23-1: growth system screw; 23-2: growth rotation drive; 23-3: growth lifting drive; 23-4: growth lifting plate; 24: seed crystal holder; 25: LEC seed crystal; 26: first thermocouple; 27: second thermocouple; 28: third thermocouple; 29: fourth thermocouple; 30: red phosphorus; 31: metallic solid raw material; 32: LEC crystal; 33: VGF crystal; 34: fifth heater; 35: VGF seed crystal; 36: fifth thermocouple; 37: upper thermal insulation cover; 38: vacuum pipeline; 39; inflation pipeline; 40: quartz wire mesh.

DETAILED DESCRIPTION OF THE EMBODIMENTS

The present invention will be further illustrated below in conjunction with the drawings.

Figure 1:
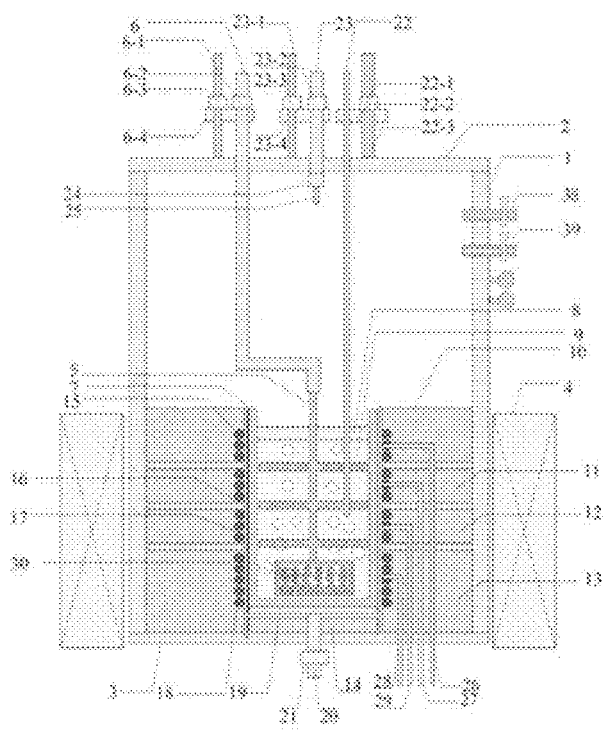
FIG. 1 is a structure diagram of a device for implementing a method in the present invention.

Refer to FIG. 1, a device for immersed synthesis and growth of phosphides under a magnetic field is provided, a main furnace body 1, an upper furnace cover 2, and a furnace base tray 3 constitute a crystal growth space, and a crucible 7, a mated crucible support 19, a lower thermal insulation layer 14, a crucible rod 20 and a crucible rod drive 21 are in the space. Heaters and thermal insulation layers are disposed surrounding the crucible 7.

Figure 2:
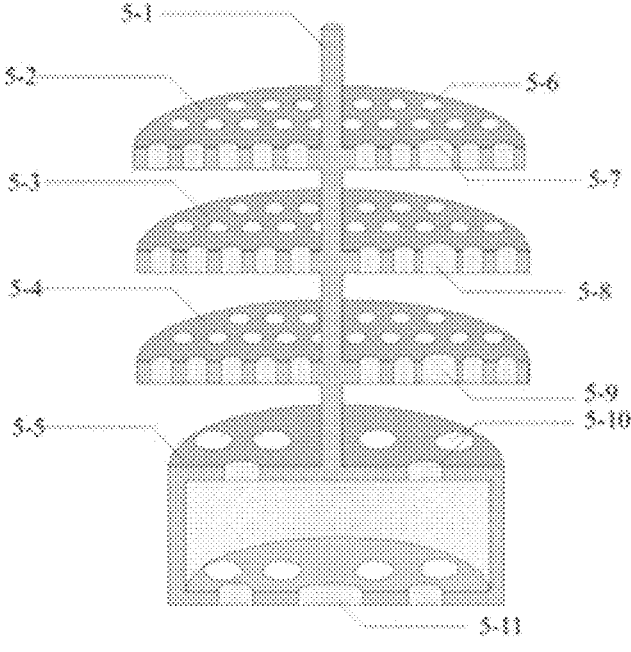
FIG. 2 is a structure diagram of a synthesis system.

Refer to FIG. 2, an injection synthesis system 5 in the main furnace body 1 is provided with a synthesis main body rod 5-1, and 3 to 5 disc-shaped shielding layers are disposed at the upper end of the synthesis main body rod 5-1. It is better that the edge of the shielding layer is closer to the inner wall of the crucible. In order not to affect the up and down movements of the injection synthesis system 5 in the crucible, in this example, the diameter of the shielding layer is smaller than the inner diameter of the crucible 7 by 1 to 10 mm, and three shielding layers are disposed, which are the first shielding layer 5-2, the second shielding layer 5-3 and the third shielding layer 5-4, respectively, and through holes 5-6 are formed in each of the shielding layers. A cylindrical red phosphorus injector 5-5 is disposed under the synthesis main body rod 5-1, and the periphery of the red phosphorus injector 5-5, including the upper surface, the lower surface and the side face, is provided with injection holes 5-10.

Figure 6:
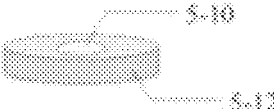
FIG. 6 is a structure diagram of a sealing cap.

The injection synthesis system 5 is provided with a loading inlet 5-11 at the bottom, used in cooperation with a sealing cap 5-12, as shown in FIGS. 2 and 6.

The injection holes 5-10 have a diameter of 5 to 10 mm, and the distance from center to center of the injection holes 5-10 is greater than twice the diameter of these holes.

The through holes 5-6 have a diameter of 5 to 10 mm, and the distance from center to center of the through holes 5-6 is greater than twice the diameter of these holes.

Phosphorus bubbles rise within the melt through the injection holes 5-10 and the through holes 5-6. Theoretically, the more the holes are, the smaller the size is, and the more the bubbles formed are; and the absorption of the synthesis is the best.

When the phosphorus bubbles pass through the injection holes 5-10 and the through holes 5-6, some of the bubbles will be broken into smaller bubbles.

In order to split the bubbles more uniformly and increase the contact area of the bubbles with the melt, bubble splitting devices are disposed on the red phosphorus injector 5-5 and the shield layers.

The bubble splitting device may be a line disposed in a hole, but it is difficult to be arranged as the diameters of both the injection holes 5-10 and the through holes 5-6 are not large.

Figure 7:
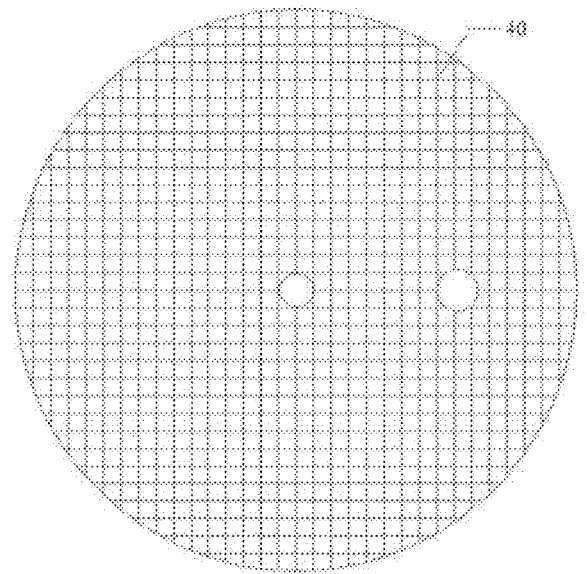
FIG. 7 is a structure diagram of a quartz wire mesh.

In this example, as shown in FIG. 7, a quartz wire mesh 40 is used as the bubble splitting device, the grid of the quartz wire mesh 40 is square, and the side length of the square is less than 3 mm and smaller than the diameter of the through holes 5-6, thus ensuring that quartz wires exist on top of each through hole 5-6. The quartz wire mesh is circular, matching the sizes of the red phosphorus injector 5-5 and the shield layers.

The quartz wire mesh covering the shielding layer is also provided with a hole to match the furnace top thermocouple 22. In this example, 3 shielding layers exist, and the quartz wire mesh 40 can be disposed on top of the red phosphorus injector 5-5 and each of the shielding layers, or the quartz wire mesh 40 can be disposed only on top of the bottom third shielding layer 5-4.

Figure 8:
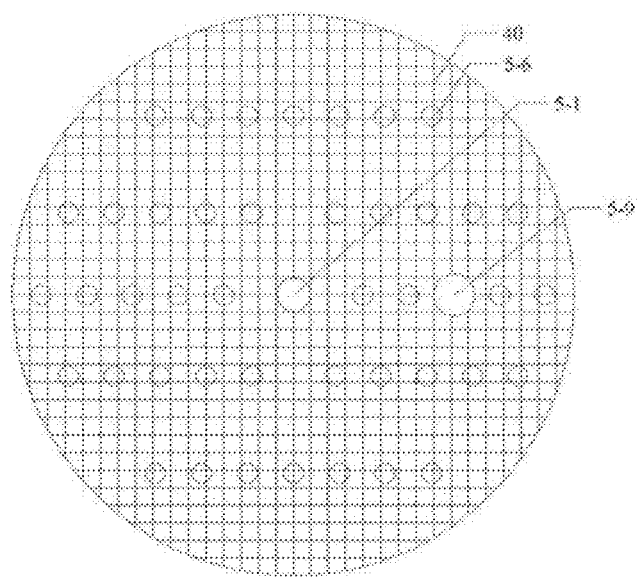
FIG. 8 is a schematic view of a quartz wire mesh covering and isolation layer.

The cooperation of the quartz wire mesh with the shielding layers is as shown in FIG. 8.

The red phosphorus injector 5-5 and the shielding layers are connected to the driving device via the synthetic main body rod 5-1 to ascend and descend simultaneously.

The driving device includes an injection rod 6, an injection system screw 6-1, an injection rotation drive 6-2, an injection lifting drive 6-3 and an injection lifting plate 6-4, the injection rod 6 being connected to the synthesis main body rod 5-10.

The system is also configured with a top thermocouple 22 that passes through the upper furnace cover 2 and is movable up and down, the top thermocouple 22 being aligned with the position of the crucible 7.

The first shielding layer 5-2, the second shielding layer 5-3 and the third shielding layer 5-4 are provided with a first thermometer hole 5-7, a second thermometer hole 5-8 and a third thermometer hole 5-9 at the same position to cooperate with the top thermocouple 22, so as to achieve that the top thermocouple 22 passes through respective shielding layers to enter into the interior of the crucible.

The top thermocouple 22 has a driving device to realize up and down movements, and the driving device includes a temperature measurement drive 22-1, a temperature measurement fixing plate 22-2 and a temperature measurement screw 22-3.

According to the positions of the shielding layers, the crucible 7 is divided into different temperature areas, having temperature area ranges between every two shielding layers, above the shielding layer at the top, and below the shielding layer at the bottom; and each temperature area is provided with an independent heater and a thermocouple.

Refer to FIG. 1, in this example, three shielding layers exist, which divide the crucible into four temperature areas: a first temperature area above the first shielding layer 5-2, a second temperature area between the first shielding layer 5-2 and the second shielding layer 5-3, a third temperature area between the second shielding layer 5-3 and the third shielding layer 5-4, and a fourth temperature area below the third shielding layer 5-4.

Respective temperature areas are surrounded by a first thermal insulation layer 10, a second thermal insulation layer 11, a third thermal insulation layer 12, and a fourth thermal insulation layer 13, respectively. In the ranges corresponding to respective temperature areas surrounding the crucible 7, independent heaters, i.e., a first heater 15, a second heater 16, a third heater 17, and a fourth heater are provided, and match a first thermocouple 26, a second thermocouple 27, a third thermocouple 28, and a fourth thermocouple 29.

Thermal insulation boards are disposed in the thermal insulation layers surrounding the crucible 7, the positions of the thermal insulation boards correspond to the positions of the first shielding layer 5-2, the second shielding layer 5-3 and the third shielding layer 5-4.

A static magnetic field generator 4 is disposed outside the main furnace body 1 corresponding to the position of the crucible 7.

Using the above device, an indium melt is first heated to 250-300° C. and then a quartz injection system with multi-layer baffles is inserted into the indium melt. Gradient distribution of the temperature of the indium melt is achieved by designing a plurality of temperature areas to control heating, providing the injection system with multi-layer baffles, and applying a transverse static magnetic field to the melt to suppress convection. The injector loaded with solid red phosphorus is located in the lowest area at a temperature of 600-700° C., and the highest temperature in the high temperature area is 30-200° C. above the melting point of the synthesized semiconductor material. The solid red phosphorus is sublimated to a gas by heating, and forms bubbles that float upward in the melt and are rapidly absorbed in the high temperature area, the transverse magnetic field suppress the up-floating rate of the bubbles to achieve synthesis of the phosphide.

By using the above device, a method for immersed synthesis and continuous growth of phosphides under magnetic field is as follows:

A, heating the crucible to melt the metal and a covering material boron oxide in the crucible.

B, immersing red phosphorus into the crucible.

C, applying a static magnetic field surrounding the crucible, and adjusting the temperature gradient to start the synthesis.

D, performing crystal growth after completion of the synthesis.

Material Preparation

Figure 3:
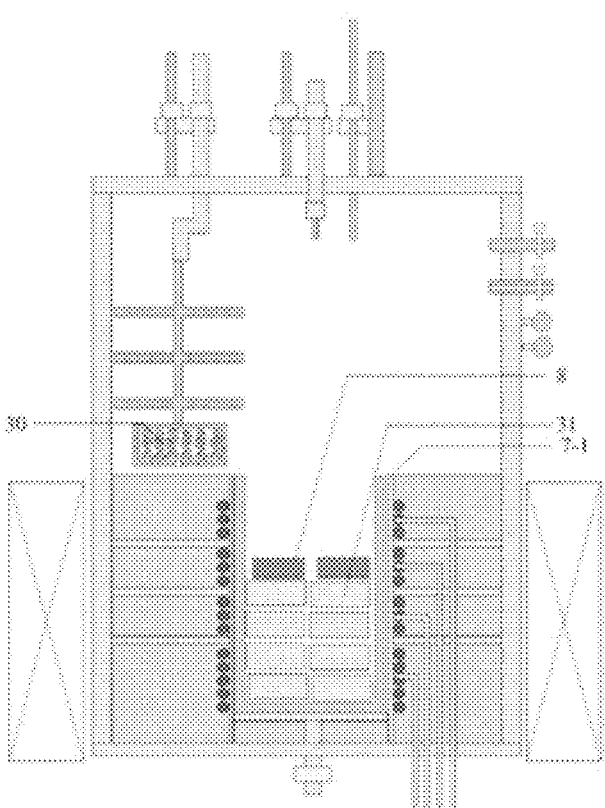
FIG. 3 is a schematic view of a thermal field and material assembly.

As shown in FIG. 3, the furnace body and the crucible are assembled.

Boron oxide 8 and a metallic solid raw material 31 are loaded into the crucible 7. The metallic solid raw material 31 is metal indium, allium or other metal with low melting point.

Lump red phosphorus 30 is loaded into the red phosphorus injector 5-5 through the loading inlet 5-11, and the sealing cap 5-12 is welded to the loading inlet 5-11.

The injection synthesis system 5 is assembled to an injection rod 6 via the synthesis main body rod 5-1. The injection rotation drive 6-2 and the injection lifting drive 6-3 are started, so that the red phosphorus injector 5-5 is away from the position right above the crucible 7.

Material Synthesis

As shown in FIG. 1, the crystal growth space is evacuated to $10^{-5}$ Pa to 10 Pa via a vacuum pipeline 38; and an inert gas is filled via an inflation pipeline 39 such that the pressure in the crystal growth space is above the saturated vapor pressure at which the melt 9 is heated to the highest pressure.

The pressure is greater than 6 to 8 MPa if indium phosphide is grown and is greater than 6 to 10 MPa if gallium phosphide is grown.

The first heater 15, the second heater 16, the third heater 17, and the fourth heater 18 are started to heat at a temperature of 250-300° C. The metallic solid raw material 31 melts into a melt 9 (the melting point of indium is 156.61° C., and the melting point of gallium is 29.8° C.), and boron oxide 8 is transformed into liquid.

The temperature is controlled by results measured by the first thermocouple 26, the second thermocouple 27, the third thermocouple 28, and the fourth thermocouple 29.

The injection rod 6 is rotated by the injection rotation drive 6-2 so that the synthesis main body rod 5-1 is located in the center of the crucible 7; and the injection synthesis system 5 is lowered by the injection lifting drive 6-3 until the first shielding layer 5-2, the second shielding layer 5-3, the third shielding layer 5-4 are aligned with the thermal insulation boards between the first heater 15, the second heater 16, the third heater 17 and the fourth heater 18. At this point, the low end of the red phosphorus injector 5-5 is about 5 mm to the bottom of the crucible 7.

The top thermocouple 22 moves downward by the temperature measurement drive 22-1, and is inserted into the melt 9 after passing through liquid boron oxide, the first thermometer hole 5-7, the second thermometer hole 5-8, and the third thermometer hole 5-9 in sequence, so as to measure the temperatures of the melt 9 in the first temperature area, the second temperature area, the third temperature area, and the fourth temperature area, respectively.

The transverse magnetic field generator 4 is started to apply a transverse static magnetic field of 0.1 to 2 T to the melt 9, so as to suppress up and down convection of the melt 9.

The power of the first heater 15, the second heater 16, the third heater 17, and the fourth heater 18 is adjusted such that the temperatures in the center of the melt 9 in the first temperature area, the second temperature area, the third temperature area, and the fourth temperature area slowly rise in sequence by heating to T1=Tm+(20–100)° C., T2=Tm+20° C., T3=900–1000° C., and T4=600–700° C. Tm is the melting point of the synthesized substance, such as synthesized indium phosphide, Tm=1062° C.; and synthesized gallium phosphide, Tm=1465° C.

The transverse magnetic field and the first shielding layer 5-2, the second shielding layer 5-3, and the third shielding layer 5-4 suppress the convection of the melt between various temperature areas, so that a temperature gradient is established between these temperature areas. At the same time, the thermal insulation boards disposed surrounding the crucible 7 corresponding to the split positions of respective temperature areas limit the transfer of heat in the thermal insulation layers.

After the temperatures of the melt 9 in the fourth temperature areas reach 600-700° C., the red phosphorus 30 in the red phosphorus injector 5-5 begins to sublimate by heating, enters the melt 9 through the injection holes 5-10, and floats upward to pass through the through holes 5-6 in the third shielding layer 5-4, the second shielding layer 5-3, and the first shielding layer 5-2 in sequence and then enter the third temperature area, the second temperature area and the first temperature area.

The sublimated phosphorus bubbles are split into small bubbles by the quartz wire meshes when passing through the quartz wire meshes. In addition, the injection holes 5-10 and the through holes 5-6 also have splitting effect on the bubbles.

As the bubbles rise to enter the respective temperature areas, the phosphorus gas within the bubbles is absorbed at an increasing rate as the temperature rises.

The transverse magnetic field reduces the deformation of the bubbles in the up-floating process and reduces the up-floating rate of the bubbles, increasing the residence time of the phosphorus gas in the bubbles in the melt 9, so the bubbles are more fully absorbed by the melt.

After the phosphorus bubbles are produced, the temperatures of the melt 9 in the fourth temperature area, the third temperature area, and the second temperature area are gradually increased at a rate of 50-100° C./h until the temperatures of the melt 9 in the fourth temperature area, the third temperature area, and the second temperature area reach T4=Tm+20° C., T3=Tm+20° C., and T2=Tm+(20–100)° C.

Material synthesis is completed through the above process.

Crystal Growth

Grow Crystal Using LEC Method:

After the red phosphorus 30 is completely gasified and no bubbles occur, the temperature of each of the first temperature area, the second temperature area, the third temperature area and the fourth temperature area is adjusted to reach Tm+50° C. and maintain for 20-30 min.

The injection synthesis system 5 is slowly lifted out of the crucible 7 by means of the injection lifting drive 6-3, and the injection synthesis system 5 is rotated to leave the position right above the crucible 7.

The operation of the transverse magnetic field generator 4 is stopped and the temperatures of the first temperature area, the second temperature area, the third temperature area, and the fourth temperature area are adjusted, so that a temperature gradient of 20-100° C./cm is established in the melt 9 from the surface to the bottom of the melt.

Figure 4:
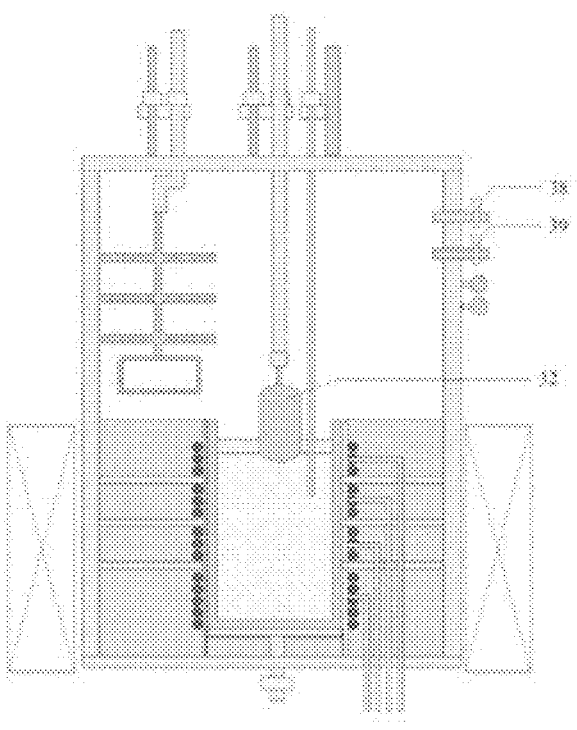
FIG. 4 is a schematic view of growth of an LEC crystal.

As shown in FIGS. 1 and 4, the seed crystal rod 23 is started to rotate and descend by the growth rotation drive 23-2 and the growth lifting drive 23-3, pulling starts after the LEC seed crystal 25 mounted to the seed crystal holder 24 contacts the melt 9, and crystal growth is performed to obtain an LEC crystal 32.

Grow Crystal Using VGF Method:

At this point, a VFG seed crystal 35, a fifth heater 34 and a fifth thermocouple 36 are disposed at the bottom of the crucible 7. The temperature of the seed crystal area can be precisely regulated and controlled through the fifth heater 34 and the fifth thermocouple 36.

After the red phosphorus 30 is completely gasified and no bubbles occur, the temperature of each of the first temperature area, the second temperature area, the third temperature area and the fourth temperature area is adjusted to reach Tm+50° C. and maintained for 5-10 hours.

The injection synthesis system 5 is slowly lifted out of the crucible 7 by means of the injection lifting drive 6-3, and the injection synthesis system 5 is rotated to leave the position right above the crucible 7.

The operation of the transverse magnetic field generator 4 is stopped and the temperatures of the first temperature area, the second temperature area, the third temperature area, and the fourth temperature area are adjusted by lowering the upper thermal insulation cover 37 via the growth lifting drive 23-3, so that a temperature gradient of 3-5° C./cm is established in the melt 9 from the bottom to the surface of the melt.

Figure 5:
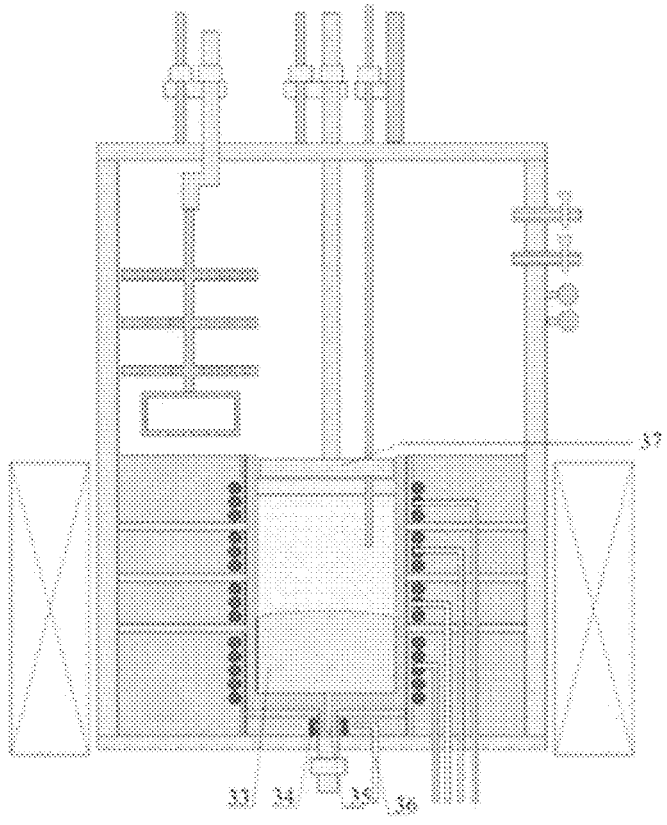
FIG. 5 is a schematic view of growth of a VGF crystal.

VGF crystal growth is performed to obtain a VGF crystal 33, as shown in FIG. 5. In the figure, the top thermocouple 22 passes through the upper thermal insulation cover 37 so as to be inserted into the melt.

What is claimed is:

1. A device for immersed synthesis and growth of phosphides under a magnetic field, comprising a main furnace body, a crucible in the main furnace body, and heaters and thermal insulation layers surrounding the crucible, wherein the device for synthesis and growth further comprises an injection synthesis system connected to a driving device, the injection synthesis system carrying red phosphorus, and immersed into the crucible under an action of the driving device; wherein a static magnetic field generator is disposed outside the main furnace body;

wherein the injection synthesis system comprises a cylindrical red phosphorus injector, and injection holes are formed at the periphery of the red phosphorus injector;

wherein the injection synthesis system also comprises 3-5 disc-shaped shielding layers above the red phosphorus injector, a diameter of the shielding layers is 1 to 10 mm smaller than an inner diameter of the crucible, and the shielding layers are provided with through holes;

wherein, according to positions of the shielding layers, the crucible is divided into different temperature areas, having temperature area ranges between every two shielding layers, above the shielding layer at the top, and below the shielding layer at the bottom; and each temperature area is provided with an independent heater and a thermocouple;

wherein the red phosphorus injector and the shielding layers are connected to the driving device to ascend and descend simultaneously;

wherein, in the thermal insulation layers surrounding the crucible, thermal insulation boards are disposed corresponding to the positions of the shielding layers; and wherein each of the shielding layers is provided with a thermometer hole at the same position to cooperate with a top thermocouple.

2. The device of claim 1 for immersed synthesis and growth of phosphides under a magnetic field, wherein the synthesis system is provided with three shielding layers, which are a first shielding layer, a second shielding layer, and a third shielding layer, respectively; the three shielding layers divide the crucible into four temperature areas: a first temperature area above the first shielding layer, a second temperature area between the first shielding layer and the second shielding layer, a third temperature area between the second shielding layer and the third shielding layer, and a fourth temperature area below the third shielding layer; and wherein the heaters corresponding to respective temperature areas are a first heater, a second heater, a third heater, and a fourth heater, respectively.

3. A method for immersed synthesis and growth of phosphides under a magnetic field, using the device for immersed synthesis and growth of phosphides under a magnetic field according to claim 1, wherein the method comprises the following steps:

A, heating the crucible to melt the metal and a covering material boron oxide in the crucible;

B, immersing red phosphorus into the crucible;

C, applying a static magnetic field surrounding the crucible, and adjusting the temperature gradient to start the synthesis; and D, performing crystal growth after completion of the synthesis.

4. The method according to claim 3, wherein in step A, the main furnace body is first evacuated to $10^{-5}$ Pa to 10 Pa, and then is inflated with an inert gas to be above the saturated vapor pressure at which the melt is heated to the highest pressure; and wherein the first heater, the second heater, the third heater, and the fourth heater are started to heat at a temperature of 250 to 300° C., and metal in the crucible is formed into a melt.

5. The method according to claim 4, wherein in step B, red phosphorus is placed in the red phosphorus injector; and wherein, under the action of the driving device, a low end of the red phosphorus injector is about 5 mm to the bottom of the crucible.

6. The method according to claim 4, wherein in step C, the transverse magnetic field generator applies a transverse static magnetic field of 0.1 to 2T to the melt.

7. The method according to claim 6, wherein in step C, a power of the first heater, the second heater, the third heater, and the fourth heater is adjusted such that a temperatures in a center of the melt in the first temperature area, the second temperature area, the third temperature area, and the fourth temperature area slowly rise by heating in sequence to T1=Tm+(20-100° C.), T2=Tm+20° C., T3=900-1000° C., and T4=600-700° C.;

wherein after the phosphorus bubbles are produced, the temperatures of the melt in the fourth temperature area, the third temperature area, and the second temperature area are gradually increased at a rate of 50-100° C./h until the temperatures of the melt in the fourth temperature area, the third temperature area, and the second temperature area reach T4=Tm+20° C., T3=Tm+20° C., and T2=Tm+(20-100° C.); and wherein Tm is the melting point of the synthesized substance.

8. The method according to claim 6, wherein in step D, an LEC method or an VFG method is used to grow a crystal.

9. The method according to claim 8, wherein after the red phosphorus is completely gasified and no bubbles occur, the temperature of each of the first temperature area, the second temperature area, the third temperature area and the fourth temperature area is adjusted to reach Tm+50° C. and maintain for 20-30 min; the operation of the transverse magnetic field generator is stopped and the temperatures of the first temperature area, the second temperature area, the third temperature area, and the fourth temperature area are adjusted, so that a temperature gradient of 20-100° C./cm is established in the melt from the surface to the bottom; and wherein pulling starts after the seed crystal contacts the melt, and crystal growth is performed to obtain an LEC crystal.

10. The method according to claim 8, wherein a VGF seed crystal is disposed at a bottom of the crucible;

wherein after the red phosphorus is completely gasified and no bubbles occur, the temperature of each of the first temperature area, the second temperature area, the third temperature area and the fourth temperature area is adjusted to reach Tm+50° C. and maintain for 20-30 min;

wherein the operation of the transverse magnetic field generator is stopped and the temperatures of the first temperature area, the second temperature area, the third temperature area, and the fourth temperature area are adjusted, so that a temperature gradient of 3-5° C./cm is established in the melt from the surface to the bottom; and wherein VGF crystal growth is performed to obtain a VGF crystal.

\* \* \* \* \*